United States Patent
Anelli et al.

(10) Patent No.: US 9,404,991 B2
(45) Date of Patent: Aug. 2, 2016

(54) AUTONOMOUSLY CALIBRATED MAGNETIC FIELD SENSOR

(75) Inventors: Giovanni Maria Anelli, Thoiry (FR); Marc Pastre, Chavannes-près-Renens (CH); Andrea Ajbl, Lausanne (CH); Maher Kayal, St-Sulpice (CH)

(73) Assignee: LEM Intellectual Property SA, Fribourg (CH)

( * ) Notice: Subject to any disclaimer, the term of this patent is extended or adjusted under 35 U.S.C. 154(b) by 660 days.

(21) Appl. No.: 13/806,080

(22) PCT Filed: Jun. 27, 2011

(86) PCT No.: PCT/IB2011/052817
§ 371 (c)(1),
(2), (4) Date: Dec. 20, 2012

(87) PCT Pub. No.: WO2012/001612
PCT Pub. Date: Jan. 5, 2012

(65) Prior Publication Data
US 2013/0093412 A1    Apr. 18, 2013

(30) Foreign Application Priority Data
Jun. 30, 2010   (EP) .................................. 10168027

(51) Int. Cl.
*G01R 33/12* (2006.01)
*G05F 1/10* (2006.01)
*G01R 35/00* (2006.01)
*G01R 33/00* (2006.01)
*G01R 33/07* (2006.01)

(52) U.S. Cl.
CPC .......... *G01R 35/005* (2013.01); *G01R 33/0017* (2013.01); *G01R 33/0029* (2013.01); *G01R 33/0035* (2013.01); *G01R 33/07* (2013.01)

(58) Field of Classification Search
CPC ...... G01R 33/09; G01R 33/07; G01R 33/098; G01R 33/093
USPC .......... 324/202, 252, 97, 754.29, 166, 117 H, 324/207.2, 762.02, 251, 207.24, 207.26, 324/754.28, 713, 762.01, 762.05, 108–109, 324/210, 204
See application file for complete search history.

(56) References Cited

U.S. PATENT DOCUMENTS

| | | | | |
|---|---|---|---|---|
| 6,429,727 | B1 * | 8/2002 | Gibson ................... | G05F 3/205 327/538 |
| 7,746,065 | B2 * | 6/2010 | Pastre ................. | G01R 33/0035 324/202 |
| 2007/0247141 | A1 * | 10/2007 | Pastre ................ | G01R 33/0035 324/202 |

(Continued)

OTHER PUBLICATIONS

International Search Report and Written Opinion issued by the European Patent Office, dated Aug. 1, 2011, for related International Application No. PCT/IB2011/052817; 12 pages.

*Primary Examiner* — Patrick Assouad
*Assistant Examiner* — Taqi Nasir
(74) *Attorney, Agent, or Firm* — Faegre Baker Daniels LLP (57) ABSTRACT

Magnetic field sensor including a magnetic field sensing circuit (2) comprising a reference magnetic field generator (8) and a magnetic field sensing cell (6), and a signal processing circuit (4) connected to the output of the magnetic field sensing cell and comprising a demodulator circuit and a gain correction feedback circuit (30, 28, 47) for correcting error fluctuations in the transfer characteristic of the magnetic field sensor. The sensor further comprises a reference current generator (3) configured to generate a reference current I ref, the reference current generator connected to the magnetic field sensing circuit (2) configured for generating the reference magnetic field B ref and to the gain correction feedback circuit configured for providing a reference signal ($y_{ref}$) to which an output signal of the demodulator circuit may be compared.

11 Claims, 6 Drawing Sheets

(56) References Cited

U.S. PATENT DOCUMENTS

2008/0054830 A1* 3/2008 Kausch ............... H02P 6/16 318/268

2008/0238410 A1* 10/2008 Charlier ............ G01R 33/0017 324/202

2010/0052665 A1* 3/2010 Van Den Homberg ................... B82Y 25/00 324/228

* cited by examiner

AUTONOMOUSLY CALIBRATED MAGNETIC FIELD SENSOR

The present invention relates to a magnetic field sensor that is autonomously calibrated to compensate for fluctuations in the transfer characteristic due to factors, such as temperature, ageing, mechanical stress, and voltage offset. The present invention also relates to a current sensor that measures the current flowing in an external conductor by means of the calibrated magnetic field sensor.

Magnetic field sensors that are calibrated during manufacturing to compensate for voltage offset and temperature drift cannot compensate adequately for fluctuations of the sensor transfer characteristics originating from factors such as mechanical stress and ageing of components. To address this drawback, it is known to provide sensors that are calibrated during use as described in U.S. Pat. No. 4,752,733 and WO 2006/056829.

WO2006/056829 discloses a magnetic field sensor comprising a reference magnetic field generator, a magnetic field sensing cell, and a signal processing circuit connected to the output of the magnetic field sensing cell and comprising one or more feedback loops for correcting variations in the transfer characteristic of the magnetic field sensing cell. The external magnetic field is measured by superimposing a modulated reference magnetic field on the external magnetic field, modulating the output signal of the magnetic field sensing cell at a frequency different from the modulation frequency of the reference magnetic field, one of the frequencies being an integer multiple of the other, and adding or subtracting different phases of the modulated signal in order to extract a measurement signal corresponding to the external magnetic field and a reference signal corresponding to the reference magnetic field. The reference signal is separated from the measurement signal so that it can be used in a feedback loop to compensate for error fluctuations in the magnetic field sensing cell transfer characteristic and at the same time produce an output sensor signal that is free of the reference field component.

The generation of the modulated reference magnetic field however relies on an external reference current source for the reference coil generating the reference magnetic field, which complicates the installation and interconnection of the sensor to external circuitry and components and increases overall costs of implementation. Reliance on an external reference current may also reduce reliability or accuracy of the sensor.

In view of the aforegoing, an object of this invention is to provide a reliable magnetic field sensor that remains accurate over time and is easy and economical to implement in external circuitry or devices.

It is a further object to provide an electrical current sensor including a reliable magnetic field sensor that remains accurate over time and is easy and economical to implement in external circuitry or devices.

It is advantageous to provide a magnetic field sensor with inputs and outputs that allow easy configuration and implementation in different circuits for various applications.

It is advantageous to provide a magnetic field sensor that is economical to manufacture on an industrial scale.

Disclosed herein is a magnetic field sensor including a magnetic field sensing circuit comprising a reference magnetic field generator and a magnetic field sensing cell, and a signal processing circuit connected to the output of the magnetic field sensing cell and comprising a demodulator circuit and a gain correction feedback circuit for correcting fluctuations in the transfer characteristic of the magnetic field sensor, including fluctuations due to errors. The sensor further comprises a reference current generator configured to generate a reference current, the reference current generator connected to the magnetic field sensing circuit configured for generating the reference magnetic field and to the gain correction feedback circuit configured for providing a reference signal to which an output signal of the demodulator circuit may be compared.

Advantageously, incorporation of an internal reference current generator in the sensor simplifies implementation in external circuits for various applications, such as for current sensing applications.

The reference current generator may be connected to a reference coil of the reference magnetic field generator via a current mirror circuit configured to copy the reference current and to generate a second reference current that drives the coil to generate the reference magnetic field.

The gain correction feedback circuit may be connected to the reference current generator via a current mirror circuit configured to copy the reference current $I_{ref}$ and to generate a further reference current that is fed into the gain correction feedback circuit. The current mirror circuit may be connected to a demodulator of the gain correction feedback circuit.

The reference current generator may comprise an integrated circuit element generating a bandgap voltage reference $V_{BG}$ applied across an internal resistor $R_{BS}$ to generate the reference current $I_{ref}$.

The signal processing circuit may include a voltage-current (V/I) conversion circuit connected to outputs of a measurement signal demodulator of the signal processing circuit. The voltage-current (V/I) conversion circuit may advantageously be combined with the sample and hold function on the measurement signal.

The signal demodulator circuit may comprise at least two demodulators in parallel configured to separate the measurement signal and the reference signal simultaneously, or a single demodulator operable in at least two successive demodulation modes configured to process the measurement and reference signals separately, for example by time division multiplexing.

In an embodiment, the magnetic field sensor may be integrated in an electrical current sensor for measuring an electrical current flowing in a conductor by measuring an external magnetic field generated by the current to be measured. The current sensor may comprise a magnetic core made of a material with high magnetic permeability and having an airgap in which the magnetic field sensing cell is positioned.

Further objects and advantageous features of the invention will become apparent from the claims, the following description, and the drawings in which:

Figure 2:
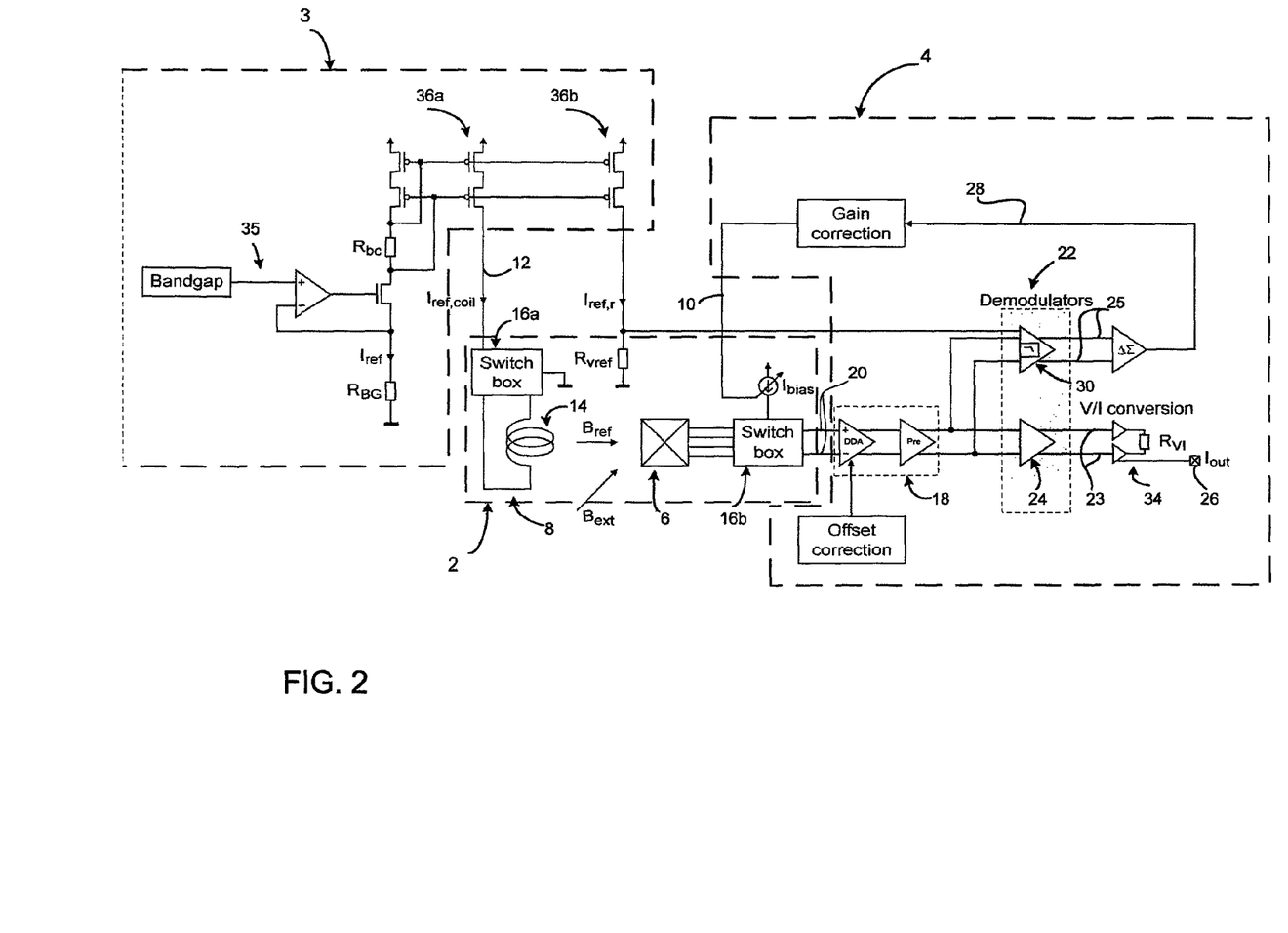
FIG. 2 is a diagram illustrating the circuit of a magnetic field sensor according to an embodiment of this invention.

Referring first to FIG. 2, a schema illustrating the principle of a circuit of a magnetic field sensor 1 according to an embodiment of the invention is shown comprising generally a magnetic field sensing circuit 2, an internal reference current generator 3 and a signal processing circuit 4. The magnetic field sensing circuit 2 comprises a magnetic field sensing cell 6, a reference magnetic field generator 8, and a gain correction input 10. The magnetic field sensor according to this invention may advantageously be used as a current sensor, based on detecting the magnetic field generated by the current to be measured. The magnetic field sensor according to this invention may also be implemented in other magnetic field sensing applications.

The magnetic field sensing cell 6 may comprise one or a plurality of magnetic field sensing elements, for example a Hall effect sensor or an array of Hall effect sensors formed in an integrated circuit as is known in the art, the magnetic field sensing cell 6 further comprising a modulator for modulating the output signal of each magnetic field sensing element. Other magnetic field sensors such as fluxgate, giant magneto resistive or other known magnetic field sensors may also be used within the scope of this invention.

The reference magnetic field generator 8 comprises a modulated reference current input 12 feeding a coil reference current $I_{ref,coil}$ driving one or a plurality of reference coils 14 for the purposes of generating a reference magnetic field $B_{ref}$ applied to the magnetic field sensing cell 6. The clock frequency at which the reference coil and magnetic field sensor signal modulators are driven are controlled by switch boxes 16a, 16b whereby the clock frequency of the magnetic field sensing cell modulator is preferably an even factor or multiple, for example one half or two, of the clock frequency controlling the reference coil modulator.

The signal processing circuit 4 comprises an amplifier circuit portion 18, connected to the outputs 20 of the magnetic field sensing cell 6, a demodulating circuit portion 22 and a feedback loop 28 for gain correction feeding back to the input of the magnetic field sensing cell 6. The demodulating circuit portion has a demodulator 24 with an output 23 leading to the magnetic field sensor output 26, a demodulator 30 with an output 25 leading into the gain correction feedback line 28, and a demodulator 32 with an output leading into an offset correction feedback line 27.

The purpose of the demodulators is to separate both components present in the signal at the output of the amplifier, namely the measurement signal and the reference signal. If both signals are present simultaneously, the demodulators can extract the signals by additions and subtractions, as described in WO 2006/056829. This can be done on both signals simultaneously using two demodulators in parallel. Another option is to extract the reference and measurement signals using one single demodulator, which is then operated in two successive demodulation modes. The same approach can also be applied when the measurement and reference signals are processed separately in the amplification chain, i.e. when the sensors are connected so to measure only the external field or the reference field while canceling the other signal.

In the embodiment of FIG. 2, separate demodulators 32, 30 are used for offset correction and gain correction to improve accuracy and responsiveness. A single demodulator which feeds into the offset correction feedback line and gain correction feedback line could however be used. It would further be possible to have only a single demodulator for the feedback lines and the sensor output line 26 by adapting the demodulation scheme to intermittently produce the output signal and offset correction signals. In other words, connected to the pre-amplifier output can be as many demodulators as necessary to demodulate the different components present in the signal:

The measurement of the external magnetic field $B_{ext}$

The measurement of the reference magnetic field $B_{ref}$ used to calibrate the gain The sensor and preamplifier offset Each of these signal components can be extracted by a separate demodulator as shown in FIG. 2, or some of them can be extracted one after another by the same demodulator applying different demodulation schemes on a periodic time basis.

In the present invention, the output of the measurement signal demodulator 24 is advantageously a voltage output, whereby the magnetic field sensor output 26 may thus be easily configured to be a voltage output, or to be a current output by means of a voltage-current (V/I) conversion circuit 34 connected to the demodulator outputs 23. The choice of output—current or voltage—improves the flexibility of implementation of the magnetic field sensor in an external circuit.

Figure 1:
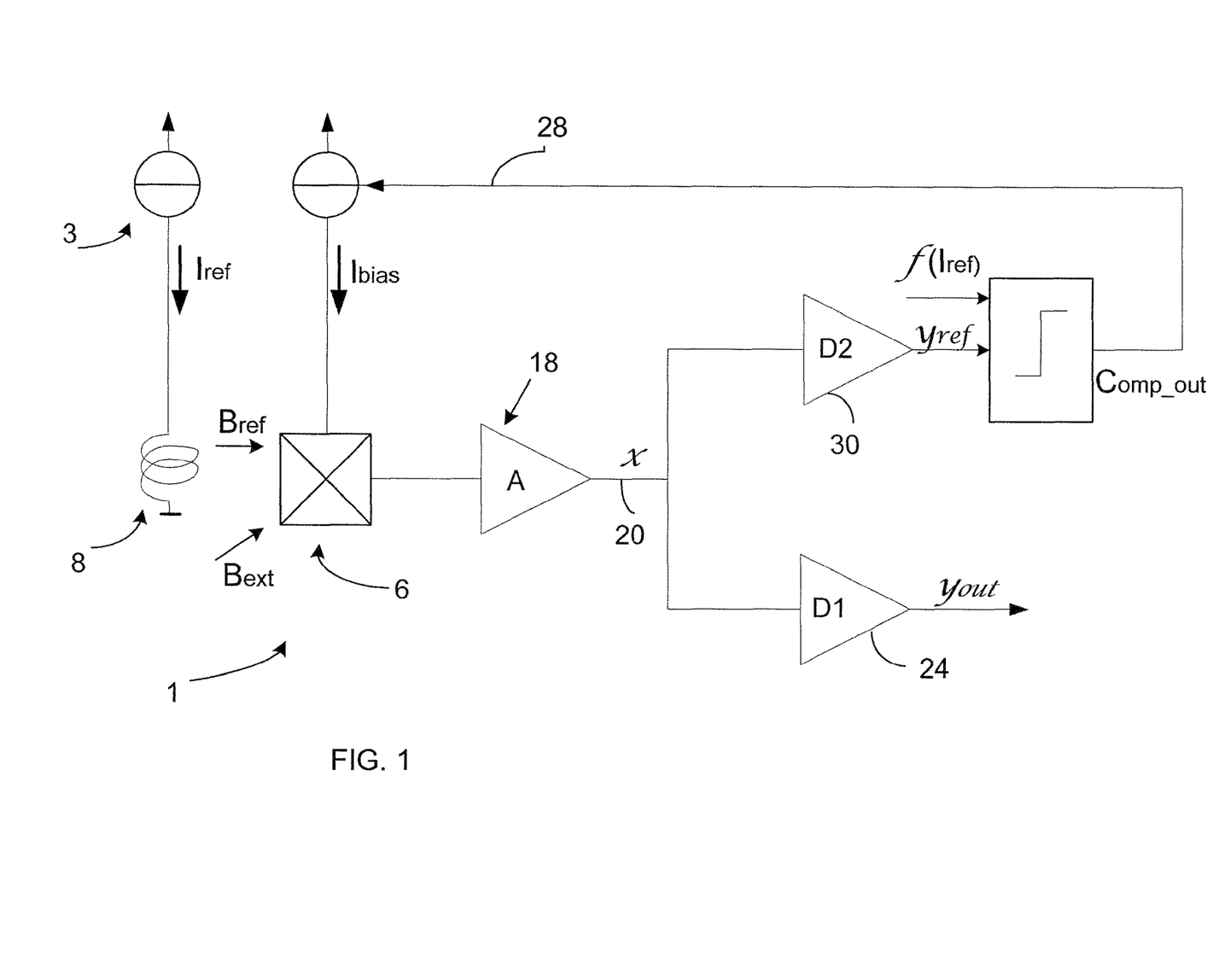
FIG. 1 is a diagram schematically illustrating the overall circuit principle of a magnetic field sensor according to an embodiment of this invention.

Referring now to FIG. 1, the general functioning principle of the sensor according to an embodiment of the invention will be broadly described, before discussing more specific embodiments or aspects thereof illustrated in FIGS. 2 and 3. As mentioned above, the circuit comprises a gain correction feedback circuit with a feedback loop 28. In order to measure the gain error, a reference signal is generated and amplified along with the external signal. To generate the reference signal, a stable reference current $I_{ref}$ is needed. An advantageous aspect of the invention is that the stable reference current $I_{ref}$ is generated by the internal reference current generator 3 that is used to generate a reference magnetic field $B_{ref}$ through the reference coil 14:

$$B_{ref} = E_{coil} I_{ref} \quad (1)$$

where $E_{coil}$ is the coil efficiency. By varying the direction of the current reference $I_{ref}$, reference magnetic field $B_{ref}$ can be positive or negative. Therefore the total magnetic field (B) present at the input of the magnetic field sensor 6—for instance a Hall sensor—is a sum or a difference of the external ($B_{ext}$) and reference ($B_{ref}$) field. The magnetic field sensor generates the voltage:

$$V_H = S_I B I_{bias} \quad (2)$$

where $S_I$ is a sensitivity of the Hall sensor and $I_{bias}$ is a biasing current of the sensor. The signal x at the output of the amplifier is then:

$$x = f(A, S_I, B, I_{bias}) \quad (3)$$

where A is a gain of the amplifier.

The signal x contains the image of both external and reference field that is separated by a demodulation technique as known per se in the prior art, for instance as described in WO2006/056829. For each signal a separate demodulator is provided.

At the output of a first demodulator D1 the signal $y_{out}$ is:

$$y_{out} = f(G_S, B_{ext}) \quad (4)$$

while the output of a second demodulator D2 is:

$$y_{out\_ref} = f(G_R, B_{ref}) \quad (5)$$

where $G_s$ and $G_R$ are the gain of the external and reference field respectively.

The demodulated signal on the reference path presents an analogue image of the reference magnetic field $B_{ref}$ through the amplifying chain. To measure an error of the gain, this signal has to be compared to some stable analogue signal generated on the chip. Reference current $I_{ref}$ is already available and stable. Additionally reference current $I_{ref}$ is generating reference magnetic field $B_{ref}$ and the output $y_{out\_ref}$ of the second demodulator D2 is an image of reference magnetic field $B_{ref}$, hence their ratio is constant and can be used for gain correction. It is necessary to ensure that the output $y_{out\_ref}$ and reference current $I_{ref}$ are comparable quantities.

If there is no variation of the gain while the signal is amplified, the output of a comparator will be zero. If there is a variation of the gain of the reference field $G_R$, then two scenarios are possible:

i) if $y_{out\_ref} > f(I_{ref})$, then the output of the comparator $C_{omp} = -\Delta$ ii) if $f(I_{ref}) > y_{out\_ref}$ then $C_{omp} = +\Delta$ This output controls the gain correction biasing current of the magnetic field sensor cell (e.g. Hall cell) 6 by decreasing/increasing the bias current $I_{bias}$ to perform a gain correction. When demodulators D1 and D2 are perfectly matched $$\Delta G_R = \Delta G_S,$$

where $\Delta G_i (i=S,R)$ signifies a gain error, and therefore the gain correction will be equally acting on the demodulator outputs $y_{out}$ and $y_{out\_ref}$, assuring that the output $y_{out}$ is an image of the external magnetic field $B_{ext}$ with a minimal error.

A signal in the amplifying chain can either be a voltage or a current. The output of a Hall sensor is already a voltage. If the amplifier output x is a voltage then the demodulator D2 output $y_{out\_ref}$ will be a voltage as well. To make this signal a comparable quantity to the reference current $I_{ref}$ then:

i) either $I_{ref}$ needs to be converted into a voltage ii) or $y_{out\_ref}$ needs to be converted into a current In order to minimize the gain error, it is also useful to ensure that variation in the gain of the reference and external fields are close to equal $\Delta G_R = \Delta G_S$.

The proposed integrated reference gives a current. The output of a reference demodulator is a voltage. These two quantities need to be compared and their difference is used for gain correction. To maintain $\Delta G_R$ as close as possible to $\Delta G_S$ the conversion of the current reference into a voltage has to be done with high precision and low temperature drift. The basic relation between the current and voltage is: $V=RI$, where R is a resistance. Possible ways of conversion would be through: (i) a very stable oscillator and capacitor which implies a stable resistor; (ii) an external resistor; or (iii) an internal resistor as proposed in embodiments of the present invention.

Preferably, the implemented solution would ensure that a change in current is proportional to a change in voltage $\Delta I \sim \Delta V$, so that the ratio of the demodulator output $y_{out\_ref}$ for gain correction and the reference current $I_{ref}$ remains intact.

A very stable oscillator is an expensive solution, while the external resistor would be a less costly solution, but the system would then not be fully integrated. An integrated resistor has high temperature drift and if it is used only in the reference path it would not be suitable for the intended sensor applications. However, if another resistor matched with the previous one is used in the signal path, then the temperature drift equally affects both reference and measurement signals and is thus cancelled out so that $\Delta G_R = \Delta G_S$. As a consequence, an output signal of the system according to the invention is a current instead of a voltage.

The functioning of a magnetic field sensor according to the embodiment illustrated in FIG. 2 will now be described. In the embodiment illustrated, the reference current generator 3 comprises an integrated circuit element generating a bandgap voltage reference $V_{BG}$ 35 that is applied across an internal resistor $R_{BG}$ to generate a reference current $I_{ref}$:

$$I_{ref} = V_{BG}/R_{BG} \tag{1}$$

The reference current may however be generated by other means—for example derived from other known sources of stable or constant voltage. The reference current $I_{ref}$ is copied by a current mirror circuit 36a to generate a second reference current $I_{ref,coil}$:

$$I_{ref,coil} = \alpha_1 I_{ref} \tag{2}$$

Where $\alpha_1$ is the nominal ratio between $I_{ref,coil}$ and $I_{ref}$.

A third reference current is also generated by a further current mirror circuit 36b:

$$I_{ref,r} = \alpha_2 I_{ref} \tag{3}$$

With $\alpha_2$ the nominal ratio between $I_{ref,r}$ and $I_{ref}$.

The second reference current $I_{ref,coil}$ biases the reference coil 14 in order to generate the reference magnetic field $B_{ref}$:

$$B_{ref} = E_{coil} I_{ref,coil} \tag{4}$$

Where $E_{coil}$ is the coil efficiency.

The third reference current $I_{ref,r}$ biases an internal resistor $R_{vref}$ in order to generate a reference voltage $V_{ref}$:

$$V_{ref} = R_{ref} I_{ref,r} \tag{5}$$

In a variant, the configuration can be simplified in the case where $I_{ref,coil} = I_{ref,r}$, because the reference coil and the reference resistor can then be placed in series and directly biased with the same current. For a magnetic field sensor in the form of a Hall sensor microsystem, the external magnetic field $B_{ext}$ may be measured and amplified to produce an amplified voltage signal $V_{A,ext}$ representative of the external field as follows:

$$V_{A,ext} = S_I I_{bias} A_{preamp} B_{ext} \tag{6}$$

where $S_I$ is the Hall sensor current-related sensitivity, $I_{bias}$ the current that biases the sensor, and $A_{preamp}$ the gain of the preamplifier chain. The reference magnetic field $B_{ref}$ can also be measured by the same circuit to produce an amplified voltage signal $V_{A,ref}$ representative of the reference field as follows:

$$V_{A,ref} = S_I I_{bias} A_{preamp} B_{ref} \tag{7}$$

The two amplified voltage signals $V_{A,ext}$ and $V_{A,ref}$ can be processed simultaneously by the system if a modulation technique is used (e.g. as in WO2006/056829), or sequentially by alternatively cancelling $B_{ext}$ and $B_{ref}$ so to process only one signal at a time.

The reference demodulator 30 is included in a sensitivity calibration loop. Its aim is to make the gain of the system, namely $S_I I_{bias} A_{preamp}$, constant during operation, so that the system displays ideal characteristics when compensated. To do so, the loop stabilizes the reference voltage signals:

$$V_{A,ref} = V_{ref} \tag{8}$$

Which results in:

$$S_I I_{bias} A_{preamp} E_{coil} \alpha_1 I_{ref} = R_{vref} \alpha_2 I_{ref} \tag{9}$$

When all terms in equation (8) are expanded using previous equations. The bias current of the magnetic field sensor is thus adjusted to be:

$$I_{bias} = (R_{vref}/S_I A_{preamp} E_{coil}) \cdot (\alpha_2/\alpha_1) \tag{10}$$

The signal output 26 of the system may be directly the amplified voltage signal $V_{A,ext}$, or its conversion into a current $I_{out}$ through a voltage-current V/I conversion circuit or through a resistor:

$$I_{out} = V_{A,ext}/R_{VT} = S_I I_{bias} A_{preamp} B_{ext}/R_{VT} \tag{11}$$

If the calibration loop is active, the bias current $I_{bias}$ calculated in equation (10) can be replaced in (11):

$$I_{out} = V_{A,ext}/R_{VI} \quad (12)$$

$$= (S_I A_{preamp} B_{ext}/R_{VI}) \cdot (R_{vref}/S_I A_{preamp} E_{coil}) \cdot (\alpha_2/\alpha_1)$$

$$= B_{ext}(1/E_{coil}) \cdot (R_{vref}/R_{VI}) \cdot (\alpha_2/\alpha_1)$$

In equation (12), it may be noted that the external field $B_{ext}$ is advantageously multiplied by a stable constant, because:
a) The efficiency of the coil depends on geometrical dimensions only, which are very little subject to change with temperature or ageing.
b) The resistor ratio $R_{vref}/R_{VI}$ can be guaranteed to be stable if both components are matched internally, i.e. the devices are made similar and are placed near each other on the silicon.
c) The current ratio $\alpha_2/\alpha_1$ can also be made stable because it may be generated by two transistors forming a current mirror which can be matched like the resistors. This implies that the calibration loop can efficiently adjust the sensitivity of the system so that the output current is:

$$I_{out} = B_{ext} \cdot K \quad (13)$$

Where K is constant and equal to:

$$K = (1/E_{coil}) \cdot (R_{vref}/R_{VI}) \cdot (\alpha_1/\alpha_2) \quad (14)$$

A sensitivity change can be caused by a change in one of the three components discussed in a), b) and c). This can advantageously be minimized for example by increasing the relative surface area occupied by the devices to improve the quality of the matching of integrated components.

Referring to FIGS. 3a to 3d, an embodiment of a voltage-current (V/I) conversion circuit 34 that may be included in the signal processing circuit 4, will now be described. According to an advantageous embodiment, the V/I circuit 34 may include a sample and hold function.

Figure 3A:
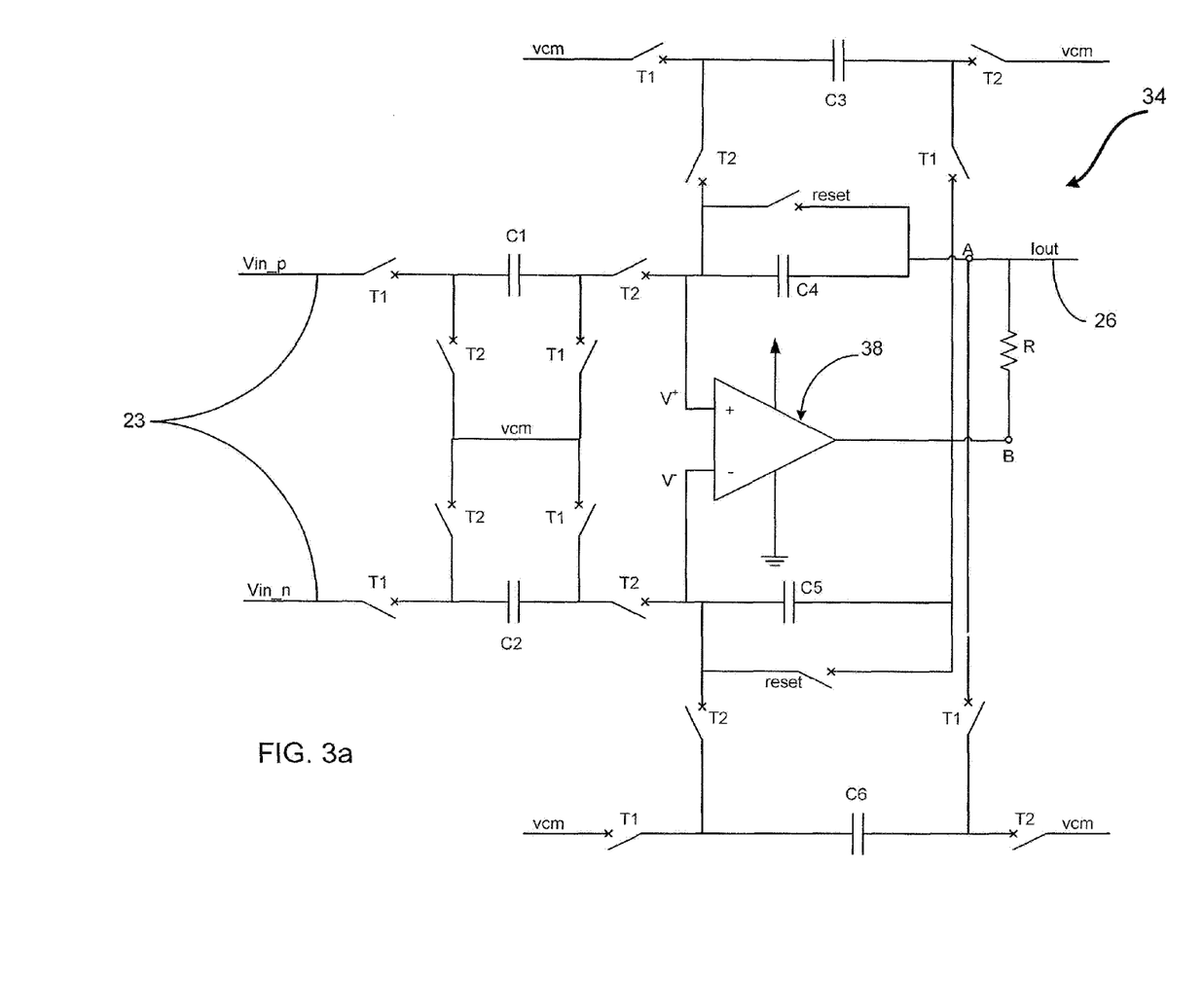
FIG. 3a illustrates an embodiment of a voltage-current conversion circuit of a magnetic field sensor according to an embodiment of this invention, the FIGS. 3b to 3d showing different connection configurations related to different operation phases of the circuit.

The integration is done through the amplifier with the capacitors C1-C5 and switches T1, T2. The sample and hold operation is possible due to the presence of the capacitors C3 and C6, while the voltage to current conversion is done through the resistor R.

Figure 3B:
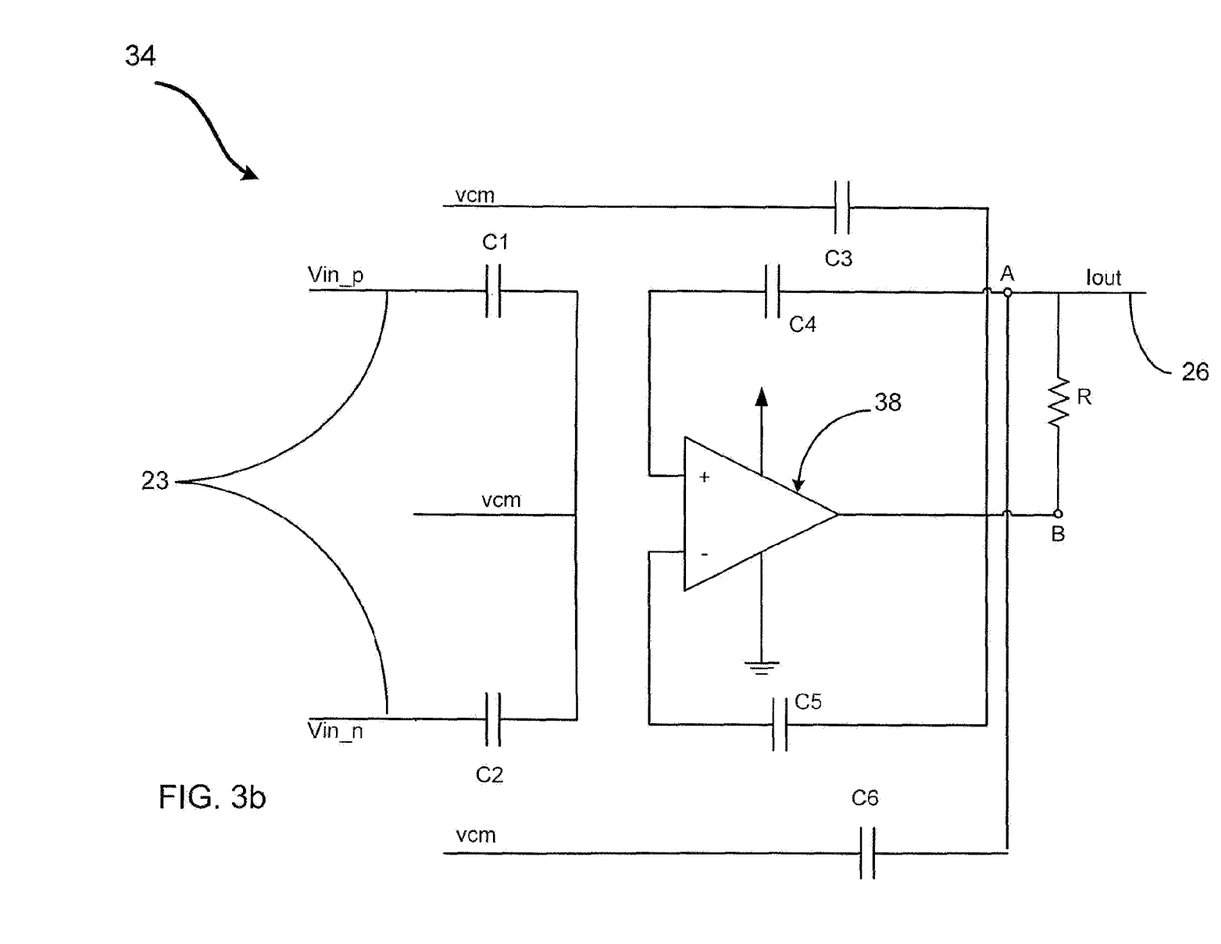

The V/I converter 34 is connected to the outputs 23 of the signal demodulator 24 and has a differential input voltage inputs Vin_n, Vin_p so we can write:

$$V_{in\_n} = vcm - Vin/2 \quad (1)$$

$$V_{in\_p} = vcm + Vin/2 \quad (2)$$

where vcm is the common-mode voltage. Operation of the voltage to current converter comprises three phases. In a first phase, switches T1 are closed (FIG. 3b). During this phase the input voltage Vin is sampled. If Qi(phase 1) represents the charge on the capacitor Ci in the first phase, then corresponding capacitor charges collected on the input capacitors C1 and C2 can be written as:

$$Q1(\text{phase 1}) = C1(V_{in\_p} - vcm) = C1 Vin(\text{phase 1})/2 \quad (3)$$

$$Q2(\text{phase 1}) = C2(V_{in\_n} - vcm) = -C2 Vin(\text{phase 1})/2 \quad (4)$$

The output of the amplifier—node B and node A—are connected to the common-mode voltage vcm through the capacitors C3 and C6. If previously C4 and C5 were discharged in a reset phase then since there is no current from the inputs of the amplifier and the voltages $V_A$ and $V_B$ at nodes A and B are equal to the supply voltage vcm: $V_A = V_B = vcm$. Therefore no current can flow through the resistor R, so the output current is zero: $I_{out} = 0$. Otherwise, if there was no reset phase, capacitor C5 would not be able to discharge since no current flows in/from the V− node so that the voltage $V_B$ at node B would keep its value from the previous cycle and $I_{out}$(phase 1) = $I_{out}$ (phase 0).

Figure 3C:
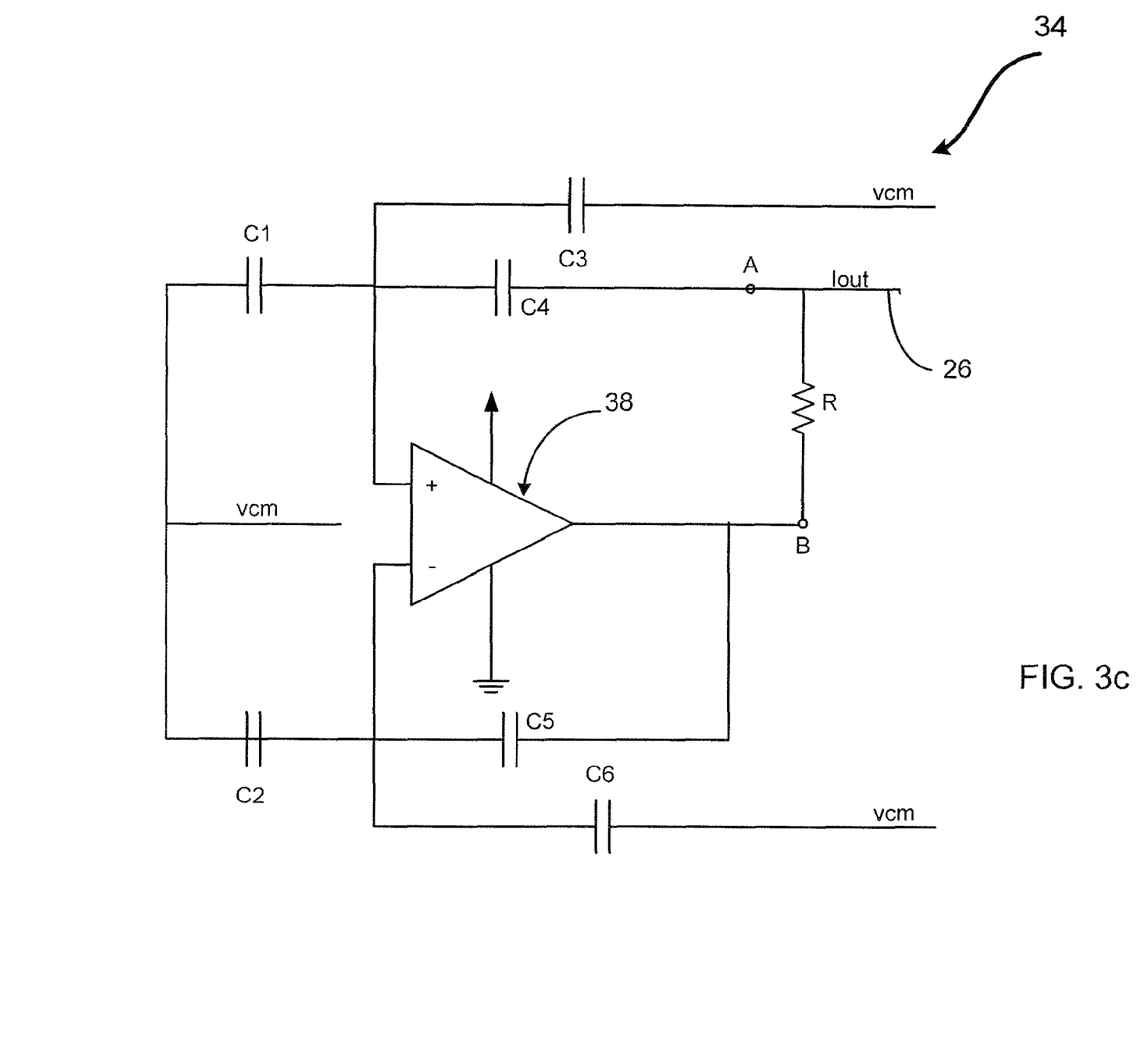
Figure 3D:
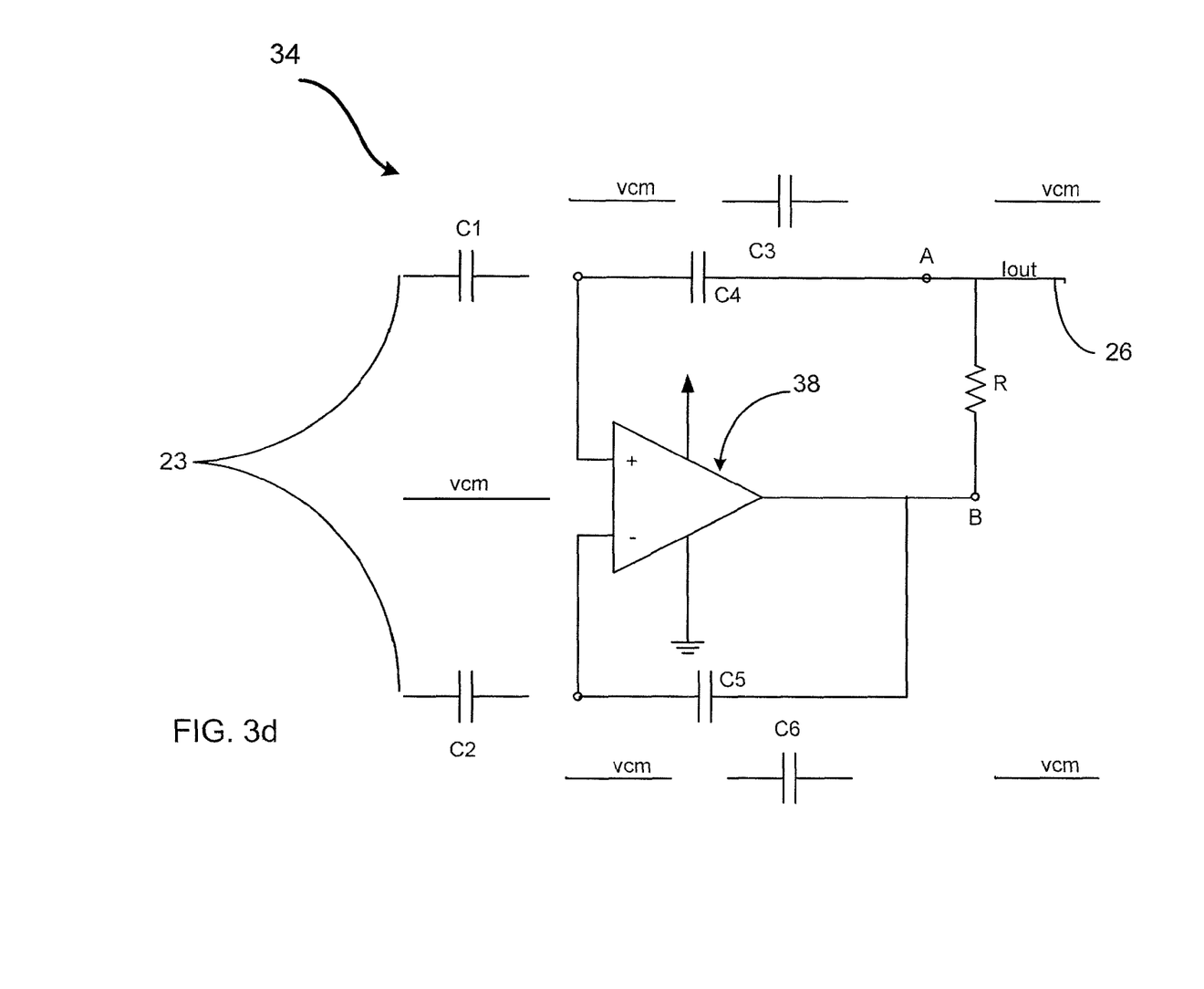

In a second phase the switches T2 are closed (FIG. 3c). The capacitor charges collected on C1 and C2 are being transferred to C4 and C5. Now the input nodes (V− node, V+ node) of the amplifier 38 are connected to the common-mode voltage vcm through capacitors C3 and C6.

$$\Delta Q1 = \Delta Q4 + \Delta Q3 \quad (5)$$

$$\Delta Q2 = \Delta Q5 + \Delta Q6 \quad (6)$$

From the equations above we can calculate the voltages at the inputs of the amplifier:

$$Q1(\text{phase 2}) - Q1(\text{phase 1}) = Q3(\text{phase 2}) - Q3(\text{phase 1}) + Q4(\text{phase 2}) - Q4(\text{phase 1}) \quad (7)$$

$$Q3(\text{phase 1}) = 0 \text{ and } Q4(\text{phase 1}) = 0 \quad (8)$$

$$C1(vcm - V + -Vin(1)/2) = C3(vcm - V+) + C4(vcm - V+) \quad (9)$$

for C3=C4 and C1=2C3

$$V+ = vcm - Vin/10 \quad (10)$$

Due to the negative feedback in the converter and high gain of the amplifier, the amplifier input voltages are equal: $V+ = V-$.

From the equations (6) and (10), the voltage at node B is $V_B = vcm - Vin/2$. Therefore the output current is directly proportional to the sampled input:

$$I_{out} = I_R = (V_B - vcm)/R = -Vin/2R \quad (11)$$

During the third phase all the switches are opened (FIG. 3d) and there is no current through the capacitors C4 and C5. In that case the voltage $V_B$ at node B will keep its previous value and the output current $I_{out}$ will not change.

The amplifier 38 used in the converter may comprise an offset cancellation within its structure. The offset may be cancelled by an input chopper, so that during one period V+=Vin_p and V−=Vin_n, while during the second period V+=Vin_n and V−=Vin_p. Since we have a single ended output when the inputs are crossed, signal paths are internally crossed as well.

The invention claimed is:

1. Magnetic field sensor including a magnetic field sensing circuit comprising a reference magnetic field generator and a magnetic field sensing cell, and a signal processing circuit connected to the output of the magnetic field sensing cell and comprising a gain correction feedback circuit for correcting fluctuations in the transfer characteristic of the magnetic field sensor, the sensor further comprising a reference current generator configured to generate a reference current $I_{ref}$, the reference current generator connected to the magnetic field sensing circuit configured for generating the reference magnetic field $B_{ref}$ and to the gain correction feedback circuit, the gain correction feedback circuit comprising a demodulator configured to generate a reference output signal $y_{out\_ref}$ that is an image of the reference magnetic field $B_{ref}$, the gain correction feedback circuit further comprising a comparator configured to compare said reference output signal $y_{out\_ref}$ to a signal $f(I_{ref})$ based on the reference current $I_{ref}$.

2. Sensor according to claim 1, wherein the reference current generator is connected to a reference coil of the reference magnetic field generator via a current mirror circuit configured to copy the reference current $I_{ref}$ and to generate a second reference current $I_{ref,coil}$ that drives the coil to generate the reference magnetic field $B_{ref}$.

3. Sensor according to claim 1, wherein the gain correction feedback circuit is connected to the reference current generator via a current mirror circuit configured to copy the reference current $I_{ref}$ and to generate a further reference current ($I_{ref,r}$) that is fed into the gain correction feedback circuit.

4. Sensor according to claim 1, wherein the current mirror circuit is connected to the demodulator of the gain correction feedback circuit.

5. Sensor according to claim 1, wherein the reference current generator comprises an integrated circuit element generating a bandgap voltage reference $V_{BG}$ applied across an internal resistor $R_{BG}$ to generate the reference current $I_{ref}$.

6. Sensor according to claim 1, wherein the signal processing circuit includes a voltage-current (V/I) conversion circuit connected to outputs of a measurement signal demodulator of the signal processing circuit.

7. Sensor according to claim 6, wherein the voltage-current (V/I) conversion circuit comprises a circuit configured to integrate and sample and hold a measurement signal.

8. Sensor according to claim 1, wherein the signal processing circuit includes a demodulator circuit comprising at least two demodulators in parallel configured to separate the measurement signal and the reference signal simultaneously.

9. Sensor according to claim 1, wherein the signal processing circuit includes a demodulator circuit comprising a demodulator operable in at least two successive demodulation modes configured to process the measurement and reference signals separately.

10. Electrical current sensor for measuring an electrical current flowing in a conductor by measuring an external magnetic field generated by the current to be measured, the electrical current sensor comprising a magnetic field sensor according to claim 1.

11. Electrical current sensor according to claim 10, comprising a magnetic core made of a material with high magnetic permeability and having an air-gap in which the magnetic field sensing cell is positioned.

* * * * *